(12) United States Patent
Ko

(10) Patent No.: US 9,728,484 B2
(45) Date of Patent: Aug. 8, 2017

(54) POWER MODULE PACKAGE AND METHOD FOR MANUFACTURING THE SAME

(71) Applicant: HYUNDAI MOBIS Co., Ltd., Yongin-si, Gyeonggi-do (KR)

(72) Inventor: Jae Hyun Ko, Yongin-si (KR)

(73) Assignee: HYUNDAI MOBIS Co., Ltd., Yongin-si (KR)

( * ) Notice: Subject to any disclaimer, the term of this patent is extended or adjusted under 35 U.S.C. 154(b) by 0 days.

(21) Appl. No.: 15/179,752

(22) Filed: Jun. 10, 2016

(65) Prior Publication Data

US 2017/0162468 A1    Jun. 8, 2017

(30) Foreign Application Priority Data

Dec. 7, 2015 (KR) .................. 10-2015-0173010

(51) Int. Cl.
*H01L 23/34* (2006.01)
*H01L 23/373* (2006.01)
(Continued)

(52) U.S. Cl.
CPC ...... *H01L 23/3735* (2013.01); *H01L 23/3121* (2013.01); *H01L 23/3675* (2013.01); *H01L 23/49833* (2013.01); *H01L 23/49861* (2013.01); *H01L 24/33* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/32225* (2013.01); *H01L 2224/33181* (2013.01); *H01L 2224/48091* (2013.01); *H01L 2224/48106* (2013.01); *H01L 2224/48245* (2013.01); *H01L 2224/73265* (2013.01); *H01L 2224/83801* (2013.01); *H01L 2224/85801* (2013.01); *H01L 2224/92247* (2013.01);
(Continued)

(58) Field of Classification Search
CPC .................. H01L 23/3735; H01L 23/3121
See application file for complete search history.

(56) References Cited

U.S. PATENT DOCUMENTS

| 2005/0116013 A1* | 6/2005 | Kwark | .................... H01L 23/66 228/180.5 |
| 2009/0091010 A1* | 4/2009 | Calo | .................... H01L 23/4952 257/675 |

(Continued)

OTHER PUBLICATIONS

Grassmann, et al., "Double Sided Cooled Module concept for High Power Density in HEV Applications", PCIM Europe 2015, May 2015, pp. 442-448.

*Primary Examiner* — Sitaramarao S Yechuri
(74) *Attorney, Agent, or Firm* — Knobbe Martens Olson & Bear LLP

(57) ABSTRACT

Disclosed relates to a power module package and a method for manufacturing the same. The power module package includes a lower substrate on which a pattern is formed, a power semiconductor element and a ribbon which are separated apart from each other at a predetermined distance to be mounted on an upper surface of the lower substrate, a first spacer attached to an upper portion of the power semiconductor element via a first adhesive layer, a second spacer attached to an upper portion of the ribbon via a second adhesive layer, and an upper substrate attached to an upper portion of each of the first and second spacers via a third adhesive layer.

6 Claims, 5 Drawing Sheets

(51) Int. Cl.
    *H01L 23/00* (2006.01)
    *H01L 23/31* (2006.01)
    *H01L 23/498* (2006.01)
    *H01L 23/367* (2006.01)

(52) U.S. Cl.
    CPC ............ *H01L 2924/01004* (2013.01); *H01L 2924/05032* (2013.01); *H01L 2924/0532* (2013.01); *H01L 2924/05432* (2013.01); *H01L 2924/1203* (2013.01); *H01L 2924/1301* (2013.01); *H01L 2924/13034* (2013.01); *H01L 2924/13055* (2013.01); *H01L 2924/13091* (2013.01); *H01L 2924/15747* (2013.01)

(56) References Cited

U.S. PATENT DOCUMENTS

| | | | | |
|---|---|---|---|---|
| 2009/0194857 A1* | 8/2009 | Liu | ................... | H01L 23/3735 257/676 |
| 2010/0007019 A1* | 1/2010 | Pendse | ................. | H01L 21/563 257/737 |
| 2014/0327127 A1* | 11/2014 | Hable | .................... | H01L 21/50 257/712 |
| 2016/0300770 A1* | 10/2016 | Taya | .................... | H01L 23/053 |

* cited by examiner

POWER MODULE PACKAGE AND METHOD FOR MANUFACTURING THE SAME

CROSS-REFERENCE TO RELATED APPLICATION

This application claims priority to and the benefit of Korean Patent Application No. 10-2015-0173010, filed on Dec. 7, 2015, the disclosure of which is incorporated herein by reference in its entirety.

BACKGROUND

1. Field

The present disclosure relates to a power module package and a method for manufacturing the same.

2. Discussion of Related Technology

A power module package means a power semiconductor product in which one or more switching elements including an insulated-gate bipolar transistor (IGBT), a diode, a metal oxide semiconductor field effect transistor (MOSFET), a thyristor, and the like are integrated on one base plate.

Generally, since power switching elements generate much heat upon operating, it is important for the power module package to select a material having a superior heat dissipation property, and also the power module package is designed in a packaging structure having superior thermal conductivity and thermal diffusion.

SUMMARY

An aspect of the present invention provides a power module package capable of maintaining a constant thickness of a package, preventing degradation of quality and a product lifespan, and promoting process stabilization and productivity improvement, and a method for manufacturing the same.

In accordance of one aspect of the present invention, a power module package includes a lower substrate on which a pattern is formed, a power semiconductor element and a ribbon which are separated apart from each other at a predetermined distance to be mounted on an upper surface of the lower substrate, a first spacer attached to an upper portion of the power semiconductor element via a first adhesive layer, a second spacer attached to an upper portion of the ribbon via a second adhesive layer, and an upper substrate attached to an upper portion of each of the first and second spacers via a third adhesive layer.

A lower surface of the second spacer may be in contact with an upper surface of the ribbon such that the second spacer may be supported by the ribbon.

The first adhesive layer may be formed at the upper portion of the power semiconductor element, and the second adhesive layer may be formed to cover the ribbon.

The power semiconductor element may be mounted on the lower substrate through soldering, and the ribbon may be mounted on the lower substrate through bonding.

In accordance with another aspect of the present invention, a method for manufacturing a power module package includes mounting a power semiconductor element and a ribbon on a lower substrate, applying a first adhesive layer on an upper surface of the power semiconductor element and a second adhesive layer to surround the ribbon, mounting a first spacer on the first adhesive layer and a second spacer on the second adhesive layer, and attaching an upper substrate to the lower substrate using a third adhesive layer.

The method may further include mounting first and second lead frames on the lower substrate, and connecting electrically the first lead frame to the power semiconductor element using a wire, wherein the mounting and the connecting may be performed between the mounting of the power semiconductor element and the ribbon on the lower substrate and the applying of the first adhesive layer on the upper surface of the power semiconductor element and the second adhesive layer to surround the ribbon.

The mounting of the power semiconductor element and the ribbon may mount the ribbon after mounting the power semiconductor element.

The mounting of the power semiconductor element and the ribbon may mount the power semiconductor element after mounting the ribbon.

The mounting of the power semiconductor element and the ribbon may mount the power semiconductor element on the lower substrate using soldering, and the ribbon on the lower substrate using bonding.

The mounting of the ribbon in the mounting of the power semiconductor element and the ribbon may be performed by bonding the ribbon to the lower substrate and compressing the bonded ribbon.

The mounting of the second spacer on the second adhesive layer may contact a lower surface of the second spacer to an upper surface of the ribbon to support the second spacer by the ribbon.

In the related art, a problem of thickness non-uniformity occurs in a power module package according to a process condition, but thickness non-uniformity of a power module package according to embodiments of the present invention may be addressed by varying a degree of compressing a ribbon depending on a process condition, for example, a thickness of the power module package.

Therefore, the thickness of the power module package may be constantly maintained, such that degradation of quality and a product lifespan caused by a non-uniform thickness may be prevented, and process stabilization and productivity improvement may be promoted.

BRIEF DESCRIPTION OF THE DRAWINGS

The above and other features and advantages of the present invention will become more apparent to those of ordinary skill in the art by describing in detail embodiments thereof with reference to the accompanying drawings, in which.

DETAILED DESCRIPTION OF EMBODIMENTS

Figure 1:
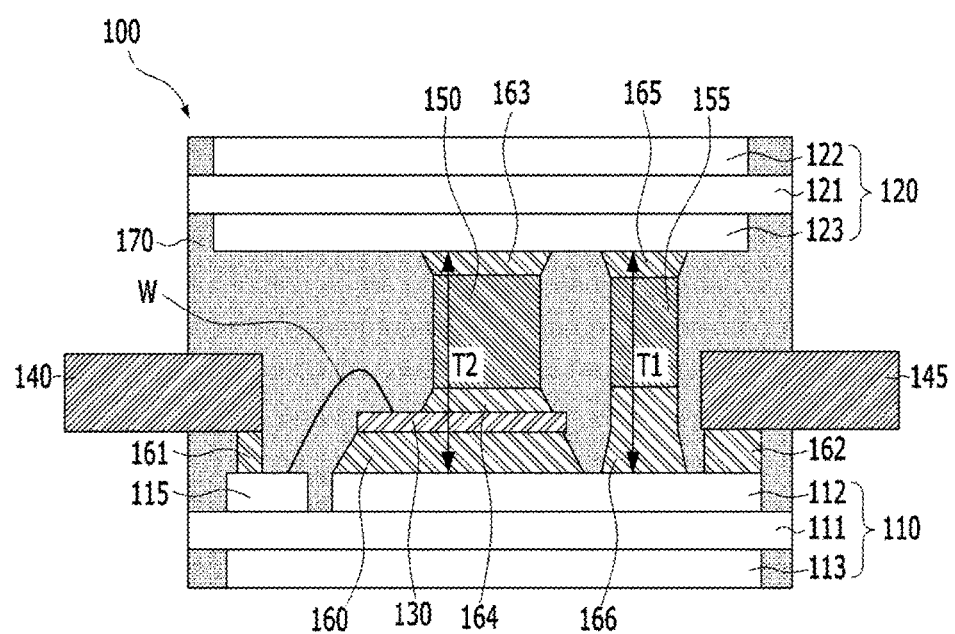
FIG. 1 is a cross-sectional view illustrating a configuration of a power module package.

Advantages, features, and implementations thereof will be apparent from the following detailed description and the accompanying drawings. The present invention, however, is not limited to embodiments to be disclosed herein and numerous other modifications can be implemented. Although the embodiments will be described with reference to a number of illustrative embodiments thereof, it should be understood that numerous other modifications and embodiments can be devised by those skilled in the art that will fall within the spirit and scope of the principles of this disclosure. The scope of the present invention should be construed by the appended claims, along with the full range of equivalents to which such claims are entitled. In giving reference numerals to components throughout the disclosure, the same reference numerals are given to the same components.

Also, in the following description, if a detailed description of known functions and configurations is determined to obscure the interpretation of embodiments of the present invention, the detailed description thereof will be omitted. And, all terms used hereinafter are selected by considering functions in embodiments, and meanings thereof may be different according to a user, the intent of an operator, or custom. Therefore, the meanings of the terms used herein should follow contexts disclosed herein.

A power module package for a vehicle, for example, an electric vehicle or hybrid vehicle, includes one or more power switching elements. Since the power switching elements generate much heat upon operating, it is important for a power module package to select a material having a superior heat dissipation property, and also the power module package is designed in a packaging structure having superior thermal conductivity and thermal diffusion because the power switching elements may be arranged in parallel with each other in a vertical direction.

Therefore, a copper plate or a direct bonded copper (DBC) type substrate, which has a superior thermal property, is employed in the power module package, and a heat pipe or a heat spreader for reducing heat of a high temperature generated in the power module package is mounted on a rear surface of the copper plater or the direct bonded copper substrate.

Although such a substrate having a superior thermal property is employed in the power module package, because securing thermal reliability of the power module package is a most prominent difficulty as a need for electricity power characteristics is increased, techniques for dissipating heat more efficiently are needed.

In order to address the above, a power module package may include a structure in which two DBC substrates are attached to each other in a symmetrical structure centering on a semiconductor chip.

FIG. 1 is a cross-sectional view illustrating a configuration of a typical power module package.

According to a configuration of a power module package 100 shown in FIG. 1, a lower substrate 110 and an upper substrate 120 are disposed in a symmetrical structure centering on a power semiconductor element 130.

At this point, the lower substrate 110 may be made of a structure in which copper layers 112 and 113 are formed on upper and lower portions of a ceramic base material 111, and the upper substrate 120 may be made of a structure in which copper layers 122 and 123 are formed on upper and lower portions of a ceramic base material 121.

Meanwhile, the power semiconductor element 130 is attached to the lower substrate 110 through a solder 170, a pattern 115 is formed on the lower substrate 110, and the power semiconductor element 130 is connected to the pattern 115 through a wire W.

And, lead frames 140 and 145 for an electrical connection with the external side are provided, and the first lead frame 140 is attached to the pattern 115 through a solder 161 and the second lead frame 145 is attached to the lower substrate 110 through a solder 162.

In addition, spacers 150 and 155 for maintaining a space between the lower substrate 110 and the upper substrate 120 are provided therebetween.

At this point, the first spacer 150 is attached between the power semiconductor element 130 and the upper substrate 120 through solders 163 and 164, and the second spacer 155 is attached between the lower substrate 110 and the upper substrate 120 through solders 165 and 166.

Finally, the power module package 100 configured as described above is completed by using the molding material 170 to expose some portions of the first and second lead frames 140 and 145 and to surround and cover the remaining portions thereof.

In the power module package 100 configured as shown in FIG. 1, if an attachment thickness T1 of the power semiconductor element 130 and the first spacer 150, and an attachment thickness T2 of the lower substrate 110 and the upper substrate 120 are not identical to each other, degradation of quality and a product lifespan may occur due to generation of voids.

Hereinafter, a power module package and a method for manufacturing the same according to an embodiment of the present invention will be described in detail with reference to the accompanying drawings.

Figure 2:
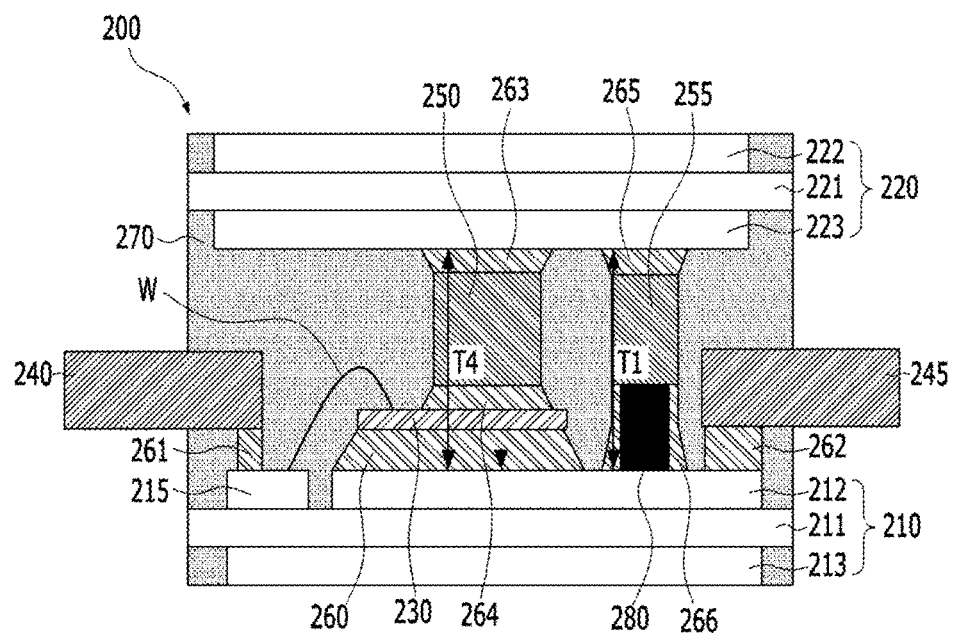
FIG. 2 is a cross-sectional view illustrating a configuration of a power module package according to an embodiment of the present invention.

FIG. 2 is a cross-sectional view illustrating a configuration of the power module package according to the embodiment of the present invention.

By taking a close look at a structure of a power module package 200 according to the embodiment of the present invention with reference to FIG. 2, a power semiconductor element 230 is disposed between first and second substrates 210 and 220 which are separated apart from each other at a predetermined distance. In embodiments, the first and second substrates 210 and 220 are disposed in a symmetrical structure centering on the power semiconductor element 230.

Here, the first and second substrates 210 and 220 may be a DBC substrate, but they are not limited thereto, and may be a metal substrate having an anode oxide layer, a printed circuit board, and a ceramic substrate.

Hereinafter, the first substrate 210 is denoted as a lower substrate and the second substrate 220 is denoted as an upper substrate, and the first and second substrates 210 and 220 are assumed to be a DBC substrate.

The lower substrate 210 may be made of a structure in which copper layers 212 and 213 are formed on upper and lower portions of a ceramic base material 211 which is formed of a material including an alumina ($Al_2O_3$), an aluminum nitride (AlN), a beryllium oxide (BeO), and the like which are an insulation base.

Similarly, the upper substrate 220 may be made of a structure in which copper layers 222 and 223 are formed on upper and lower portions of a ceramic base material 221 which is formed of a material including an alumina ($Al_2O_3$), an aluminum nitride (AlN), a beryllium oxide (BeO), and the like which are an insulation base.

However, in the lower substrate 210, the upper copper layer 212 is patterned so as to form an electrical circuit through a printed circuit board technology, thereby including a circuit pattern, whereas the lower copper layer 213 does not include a circuit pattern. And in the upper substrate 220, the upper and lower copper layers 222 and 223 have a structure with no circuit pattern.

Meanwhile, the power semiconductor element 230 may include a silicon controlled rectifier (SCR), a power transistor, an IGBT, a MOS transistor, a power rectifier, a power regulator, an inverter, a converter, a diode, or a combination thereof including a high power semiconductor chip, but it is not limited thereto. The power semiconductor element 230 may be one known in the related art.

At this point, the power semiconductor element 230 is attached to the upper copper layer 212 of the lower substrate 210 through an adhesive layer 260, and is connected to a pattern 215 through a wire W.

Meanwhile, lead frames 240 and 245 for an electrical connection with the external side are disposed at an upper portion of the lower substrate 210, and the first lead frame 240 is attached to the pattern 215 of the lower substrate 210 through an adhesive layer 261 and the second lead frame 245 is attached to the upper copper layer 212 of the lower substrate 210 through an adhesive layer 262.

And, spacers 250 and 255 for a space between the lower substrate 210 and the upper substrate 220 are disposed therebetween.

At this point, the first spacer 250 is attached between the upper substrate 220 and the power semiconductor element 230 through adhesive layers 263 and 264, and the second spacer 255 is attached between the lower substrate 210 and the upper substrate 220 through adhesive layers 265 and 266.

In embodiments, the first spacer 250 is attached to a lower surface of the lower copper layer 223 of the upper substrate 220 through the adhesive layer 263 disposed at an upper surface of the first spacer 250, and to an upper surface of the power semiconductor element 230 through the adhesive layer 264 disposed at a lower surface of the first spacer 250.

In addition, the second spacer 255 is attached to the lower surface of the lower copper layer 223 of the upper substrate 220 through the adhesive layer 265 disposed at an upper surface of the second spacer 255, and to an upper surface of the upper copper layer 212 of the lower substrate 210 through the adhesive layer 266 disposed at a lower surface of the second spacer 255.

Therefore, the upper substrate 220 is attached to the first and second spacers 250 and 255 via the adhesive layers 263 and 265.

The adhesive layers 260, 261, 262, 263, 264, 265, and 266 may be made of a solder type adhesive material, but they are not limited thereto, and all adhesive materials, for example, conductive/non-conductive epoxy and the like, known in the related art may be used.

Finally, the power module package 200 configured as described above is completed by using a molding material 270 to expose some portions of the first and second lead frames 240 and 245 and to surround and cover the remaining portions thereof.

In addition, according to the embodiment of the present invention, the power module package 200 further includes a ribbon 280, and the ribbon 280 is disposed on an upper surface of the lower substrate 210, particularly, on the upper copper layer 212 of the lower substrate 210, and spaced apart from the power semiconductor element 230 at a predetermined distance, so as to correspond to the second spacer 255.

Therefore, since the adhesive layer 266, which is disposed on the lower surface of the second spacer 255 in order for attachment of the second spacer 255, is disposed to correspond to the ribbon 280, the adhesive layer 266 is provided in the form of a shape surrounding the ribbon 280.

In particular, an upper surface of the ribbon 280 is in contact with the lower surface of the second spacer 255 to form a shape in which the second spacer 255 is supported by the ribbon 280. At this point, after being bonded to the lower substrate 210, the ribbon 280 may be compressed to be mounted thereon.

As a result, a total thickness of the ribbon 280 and the second spacer 255 may be constantly maintained with no variation regardless of outside conditions, and may be merely varied according to a degree of compression with respect to the ribbon 280.

Meanwhile, a difference generation between the thicknesses T1 and T2 is caused by a non-uniform thickness of the power semiconductor element 130 shown in FIG. 1 due to a process error, but a thickness non-uniformity generated between thicknesses T3 and T4 may be addressed by varying a degree of compression with respect to the ribbon 280 according to a thickness variation of the power semiconductor element 230 in embodiments of the present invention shown in FIG. 2.

Further, as shown in FIG. 1, a total thickness of the solder 166 and the second spacer 155 is non-uniform due to a thickness variation of the solder 166, but the second spacer 255 is supported by the ribbon 280 in embodiments of the present invention as shown in FIG. 2 such that the total thickness of the ribbon 280 and the second spacer 255 is uniformly maintained without influence of the adhesive layer 266.

Heretofore, the configuration of the power module package according to the embodiment of the present invention has been described. Hereinafter, a method for manufacturing the power module package according to the embodiment of the present invention will be described with reference to the accompanying drawings.

FIGS. 3A to 3E are views illustrating a manufacturing process of the power module package according to the embodiment of the present invention.

Figure 3A:
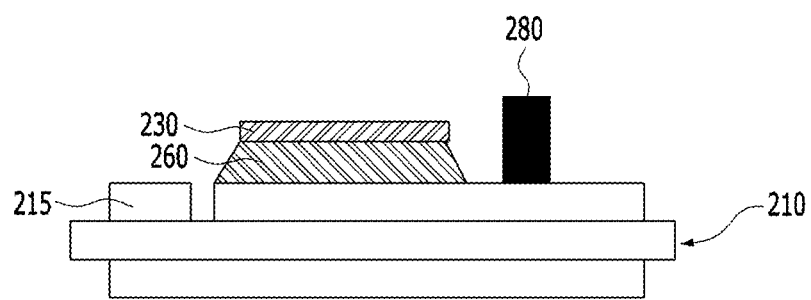
FIGS. 3A to 3E are cross-sectional views sequentially illustrating a method for manufacturing the power module package according to the embodiment of the present invention.

With reference to FIGS. 3A to 3E, the power semiconductor element 230 and the ribbon 280 are firstly mounted on the lower substrate 210 (FIG. 3A). At this point, the ribbon 280 may be mounted after the power semiconductor element 230 has been mounted, whereas, selectively, the power semiconductor element 230 may be mounted after the ribbon 280 has been mounted.

At this point, the power semiconductor element 230 may be mounted on the upper surface of the lower substrate 210 through soldering using the adhesive layer 260, and the ribbon 280 may be mounted on the upper surface of the lower substrate 210 through bonding.

In particular, the mounting of the ribbon 280 may be performed by bonding the ribbon 280 to a position at which the second spacer 255 is to be mounted and compressing the bonded ribbon 280.

At this point, a degree of compression with respect to the ribbon 280 may be varied, and may be determined according to a process condition, for example, a thickness of the power semiconductor element 230.

Figure 3B:
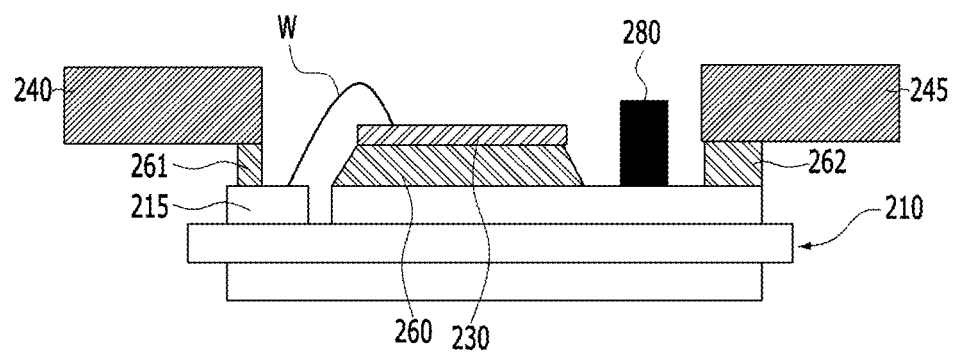

Thereafter, mounting of the lead frames 240 and 245 and bonding of the wire W are performed (FIG. 3B). At this point, the lead frames 240 and 245 are mounted on the upper surface of the lower substrate 210 through the adhesive layers 261 and 262, and in particular, the first lead frame 140 is mounted at the pattern 215 of the lower substrate 210.

And, the wire W is bonded to connect the power semiconductor element 230 to the pattern 215. In embodiments, one end of the wire W is bonded to the power semiconductor element 230, whereas the other end thereof is bonded to the pattern 215.

Figure 3C:
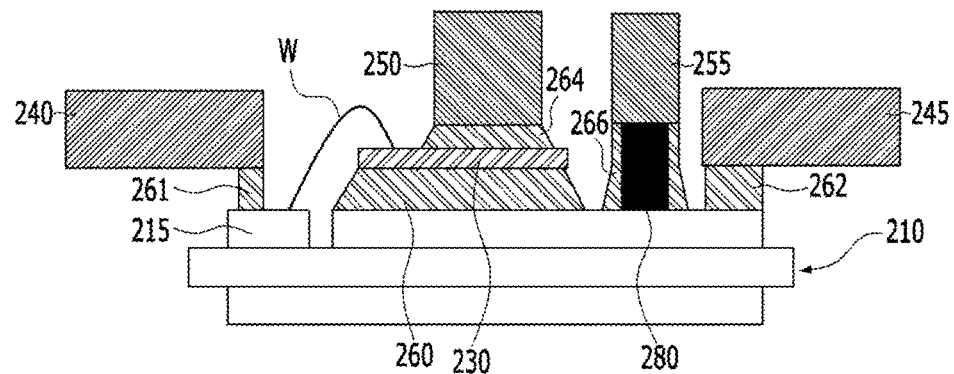
Figure 3D:
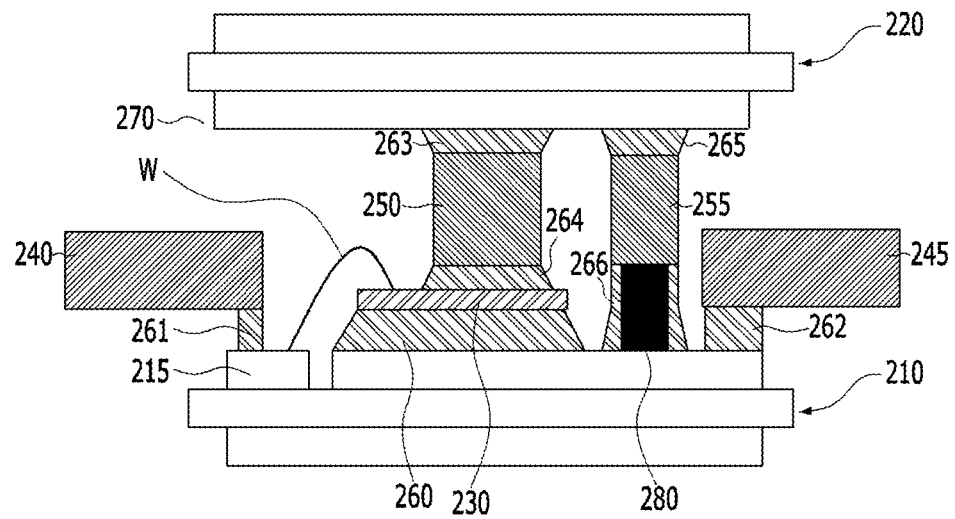
Figure 3E:
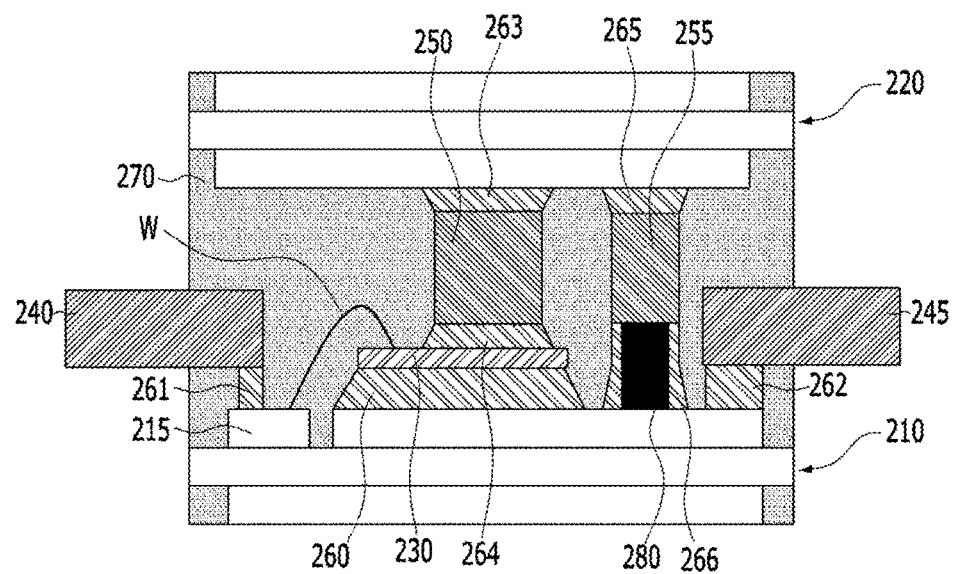

And then, mounting of the spacers 250 and 255 is performed (FIG. 3C). At this point, the first spacer 250 is mounted on the upper surface of the power semiconductor element 230 through the adhesive layer 264, and the second spacer 255 is mounted at an upper portion of the ribbon 280 through the adhesive layer 266.

Particularly, in the mounting of the second spacer 255, the lower surface of the second spacer 255 is mounted so as to be in contact with the upper surface of the ribbon 280 such that the second spacer 255 is supported by the ribbon 280.

Therefore, the mounting of the spacers 250 and 255 is performed by applying the adhesive layer 264 on the upper surface of the power semiconductor element 230, applying the adhesive layer 266 on the lower substrate 210 so as to surround the ribbon 280, and then disposing the spacers 250 and 255 on the adhesive layers 264 and 266.

And then, the upper substrate 220 is attached to the lower substrate 210 (FIG. 3D), some portions of the first and second lead frames 240 and 245 are exposed using the molding material 270, and the remaining portions thereof are molded to be surrounded, such that the power module package 200 is manufactured.

Meanwhile, in order to attach the upper substrate 220 to the lower substrate 210, the adhesive layers 263 and 265 are applied at positions of the upper substrate 220 corresponding to the spacers 250 and 255, and the upper substrate 220 and the lower substrate 210 are attached to each other in a state in which the adhesive layers 263 and 265 have been attached to the spacers 250 and 255.

Although the power module package and the method for manufacturing the same according to embodiments of the present invention have been shown and described with reference to embodiments, the scope of the present invention is not limited to particular embodiments, and it would be appreciated by those skilled in the art that alternatives, changes, and modifications may be made in these embodiments without departing from the spirit and scope of the principles of this disclosure.

The embodiments and the accompanying drawings disclosed herein, therefore, are not to be taken in a sense for limiting the technical concept of the present invention but for explanation thereof, and the range of the technical concept is not limited to these embodiments and the accompanying drawings. The scope of the present invention should be construed by the appended claims, along with the full range of equivalents to which such claims are entitled.

What is claimed is:

1. A method for manufacturing a power module package, the method comprising:
   mounting a power semiconductor element and a ribbon on a lower substrate;
   applying a first adhesive layer on an upper surface of the power semiconductor element and a second adhesive layer to surround the ribbon;
   mounting a first spacer on the first adhesive layer and a second spacer on the second adhesive layer;
   attaching an upper substrate to the lower substrate using a third adhesive layer;
   mounting a first lead frame and a second lead frame on the lower substrate; and
   connecting electrically the first lead frame to the power semiconductor element using a wire,
   wherein the mounting of the first and second lead frames and the connecting of the first lead frame to the power semiconductor element are performed between the mounting of the power semiconductor element and the ribbon on the lower substrate and the applying of the first adhesive layer on the upper surface of the power semiconductor element and the second adhesive layer to surround the ribbon.

2. The method of claim 1, wherein in mounting of the power semiconductor element and the ribbon, the ribbon is mounted after mounting the power semiconductor element.

3. The method of claim 1, wherein in mounting of the power semiconductor element and the ribbon, the power semiconductor element is mounted after mounting the ribbon.

4. The method of claim 1, wherein in mounting of the power semiconductor element and the ribbon, the power semiconductor element is mounted on the lower substrate using soldering and the ribbon is mounted on the lower substrate using bonding.

5. The method of claim 1, wherein mounting of the second spacer on the second adhesive layer causes a lower surface of the second spacer to contact an upper surface of the ribbon such that the second spacer is supported by the ribbon.

6. A method for manufacturing a power module package, the method comprising:
   mounting a power semiconductor element and a ribbon on a lower substrate;
   applying a first adhesive layer on an upper surface of the power semiconductor element and a second adhesive layer to surround the ribbon;
   mounting a first spacer on the first adhesive layer and a second spacer on the second adhesive layer; and
   attaching an upper substrate to the lower substrate using a third adhesive layer;
   wherein the mounting of the ribbon in the mounting of the power semiconductor element and the ribbon is performed by bonding the ribbon to the lower substrate and compressing the bonded ribbon.

* * * * *